United States Patent [19]
Wong

[11] Patent Number: 5,351,253
[45] Date of Patent: Sep. 27, 1994

[54] CONTINUOUSLY TUNABLE LASER OSCILLATOR AND METHOD OF CONTROLLING THE SAME

[75] Inventor: Ching K. Wong, Eindhoven, Netherlands

[73] Assignee: U.S. Philips Corporation, New York, N.Y.

[21] Appl. No.: 936,146

[22] Filed: Aug. 26, 1992

[30] Foreign Application Priority Data

Aug. 30, 1991 [EP] European Pat. Off. ........ 91202205.0

[51] Int. Cl.$^5$ ............................................. H01S 3/00
[52] U.S. Cl. ........................................... 372/38
[58] Field of Search ................................. 372/38

[56] References Cited

U.S. PATENT DOCUMENTS 4,509,130  4/1985  Menzies et al. .................... 364/556
4,942,568  7/1990  Khoe et al. .

OTHER PUBLICATIONS

"Einfugrun In Die Numerische Mathematik I" by Josef Stoer, Springer Verlag ISBN 0-387-05750-1, Chapter 5. (No English Language Translation).

*Primary Examiner*—Rodney B. Bovernick
*Assistant Examiner*—Robert E. Wise
*Attorney, Agent, or Firm*—Richard A. Weiss

[57] ABSTRACT

A laser oscillator and a method for controlling the laser oscillator. The laser oscillator has a control unit and a laser unit. The control unit applies control signals to the laser unit to control the power and wavelength of a laser light produced by the laser unit. The control unit has a calculation device for calculating values for the controls signals which will cause the power and wavelength of the laser light to be at predetermined values on the basis of the predetermined values and a truncated power series relating values for the control signals to values for the power and wavelengths of the laser light.

22 Claims, 3 Drawing Sheets

CONTINUOUSLY TUNABLE LASER OSCILLATOR AND METHOD OF CONTROLLING THE SAME

BACKGROUND OF THE INVENTION

The invention relates to a laser oscillator and a method of controlling it. The laser oscillator comprises a laser unit and a control unit for applying at least one control signal to at least the control input of the laser unit on the basis of a desired (i.e., predetermined) value of at least a physical quantity (i.e., characteristic) of the laser light.

A laser oscillator of this type is known from U.S. Pat. No. 4,509,130. Such laser oscillators are used, for example, in transmitters or receivers for coherent optical transmission systems, in spectroscopy equipment or in test equipment for optoelectric converters.

To transport a baseband signal via a glass fibre in coherent optical transmission systems, a light signal coming from a transmitting laser can be amplitude, frequency or phase modulated by the baseband signal before the light signal is fed to the glass fibre. To demodulate the light signal at a receiver with the aid of current electronic components, it is necessary to convert the light signal, which has a very high frequency (for example, $10^{14}$ Hz) to a much lower intermediate frequency, for example, $10^9$ Hz. For this purpose, the received light signal is combined in the receiver with a local laser-generated light signal with the aid of an optical coupling element. This combination provides an optical signal having amplitude variations due to interference between the two input signals of the coupling element. These amplitude variations have a frequency which is equal to the difference frequency between the frequency of the received light signal and that of the locally generated light signal. A photodiode is then used for converting the optical amplitude variations into an electrically processable intermediate-frequency signal.

To simultaneously transport more than a single light signal via a glass fibre, lasers which are tunable over a large frequency range (for example, 500 GHz) are used in both the transmitter and the receiver. As a result, more transmitters and receivers may communicate via the same glass fibre without causing interference to one another.

In prior-art laser oscillators, the physical quantity of the laser light is the frequency of the laser light. Another possible physical quantity is the power of the laser light.

In prior-an laser oscillators, the laser unit has two control inputs, a first control input for which determines the current flowing through the laser diode and a second control input determines the temperature of the laser diode. The control unit comprises a Table in the form of a ROM or a RAM in which values for the control signals are stored as functions of the desired value of the physical quantity (in this case, the frequency of the laser light).

As a result, the value of the physical quantity of the laser light may be modified in steps. With a predetermined range of values for the physical quantity of the laser light, the smallest possible step size with which the value of the physical quantity can be modified is determined by the size of the Table. A disadvantage of prior-art laser oscillators is that when the physical quantity of the laser light has a large range of values and a small step size is desired, the Table must be rather large. Thus, the RAM or ROM is required to have a large memory capacity.

SUMMARY OF THE INVENTION

It is an object of the invention to provide a laser oscillator of the type mentioned in the opening paragraph in which a large range of values for the at least one physical quantity (i.e. characteristic) with a small step size is possible without the need for a RAM or ROM with a large memory capacity (it being a further object to provide a method in which the at least one control signal can be obtained without the use of a Table).

For this purpose, the invention is characterized, in that the control unit comprises a calculation device for calculating a value for the at least one control signal on the basis of the desired (i.e. predetermined value for the at least one) physical quantity of the laser light and a continuous function, e.e., relation, between values for the at least one control signal and values for the at least one physical quantity within a working range of the laser unit there being an associated the value for the at least one control signal for each value of the at least physical quantity of the laser light within the working range of the laser unit.

Because the laser oscillator comprises a calculation device for calculating the value for the at least one control signal on the basis of the desired for the at least one value of the physical quantity and the relation, no Table is needed for looking up the value for the at least one control signal with reference to the desired value for the at least one physical quantity. However, it is conceivable for the calculation device to perform an interpolation between setting points stored in a (small) Table. Moreover, an additional advantage is that the desired physical quantity may now be adjusted to any desired value within the range values for the at least one physical quantity.

The relation between the control signal and the wavelength or the power of the laser light, respectively, will generally be such that no explicit expression may be found for the value for the at least one control signal as a function of the values for the power and/or the wavelength. The value for the at least one control signal will then have to be found by implementing numerical methods. Such numerical methods are described, for example, in the book entitled "Einführung in die Numerische Mathematik I" by Josef Stoer, Springer Verlag, ISBN 0-387-05750-1, Chapter 5.

An embodiment of the invention is characterized in that the relation between the control signal and the physical quantity of the laser light is defined by a truncated power series. By approximating the relation by way of a truncated power series, an explicit expression may be found for the control signal as a function of the physical quantity, which expression considerably reduces the necessary amount of calculations needed to determine the value for the at least one control signal.

Another embodiment of the invention is characterized in that the laser oscillator comprises a measuring device for supplying to the control unit a measurement signal which is a measure of the value of the at least one physical quantity of the laser light and the control unit comprises an adapting device for adapting the relation so as to reduce the difference between the desired and actual values of the at least one physical quantity. By comparing the value of the at least one physical quantity of the laser light to a reference value and adapting the relation in it is possible to strongly increase the absolute accuracy of the physical quantity setting.

A further embodiment of the invention is characterized in that the number of control inputs of the laser unit exceeds by a value the number of physical quantities of the laser light, the control signals satisfying n additional auxiliary conditions. An example of this is, a so-called Distributed Bragg Reflector (DBR) laser.

Such a laser comprises an amplifier section L, a transmission line section P and a (reflecting) Bragg section B. In a DBR laser, a control signal $I_a$ is applied to the amplifier section L, which current is to exceed a certain threshold to make optical amplification possible (i.e., power control). Control signals $I_p$ and $I_b$ are applied to the transmission line section P and the Bragg section B, respectively, in order to control the frequency of the laser light (i.e., wavelength control). The control signal $I_p$ in the transmission line section determines the breaking index thereof and, thus, the phase rotation of the transmission line section. The control signal $I_b$ in the Bragg section influences the breaking index thereof and, thus, determines the phase of the light reflected by the Bragg section.

For laser oscillation at a desired frequency (i.e., wavelength), the sum of the phase rotations in the Bragg section and the transmission line section is to be equal to $K \cdot 2 \cdot \pi (K \epsilon N)$, while the phase rotation in the Bragg section B is to be nearest to $\pi/2$, a marginal condition. In the event of large deviations from this marginal condition, undesired frequency jumps as a result of a sudden change of the oscillation mode of the laser during the laser tuning may occur. The change of the oscillation mode takes place because K changes in a value for which the phase rotation in the Bragg section B is nearer to $\pi/2$.

By forcing a suitably selected auxiliary condition onto the control signals $I_b$ and $I_p$, the marginal condition may be satisfied so that the undesired frequency jumps do not occur.

If the laser unit has m control inputs and if n auxiliary conditions are forced onto control signals, m-n physical quantities of the laser light may be determined. The entire system is then described by m equations (n auxiliary conditions and m-n expressions for the physical quantities) with m unknowns (the control signals). In this case, this system of equations will generally have to be solved with the aid of numerical methods.

BRIEF DESCRIPTION OF THE DRAWINGS

The invention will now be further explained with reference to the drawings, in which.

DETAILED DESCRIPTION OF THE PREFERRED EMBODIMENT

Figure 1:
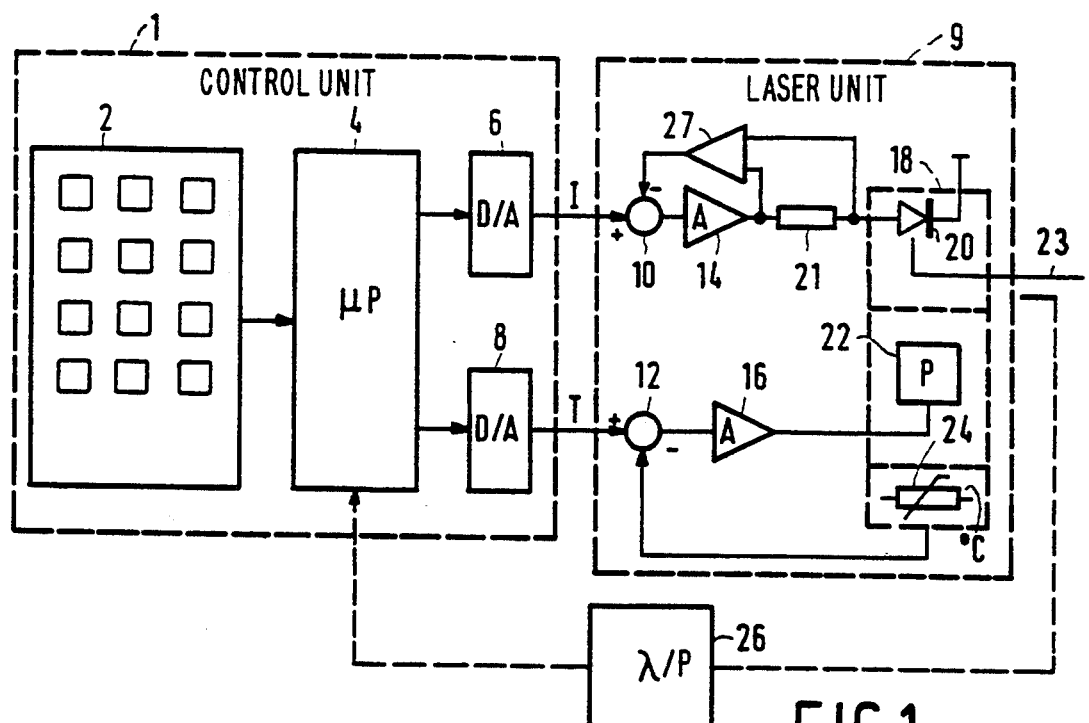
FIG. 1 shows a block diagram of a laser oscillator according to the invention.

In FIG. 1, a first control output of a control unit 1, carrying control signal I, is connected to a first control input of laser unit 9. A second control output of the control unit 1, carrying output signal T, is connected to a second control input of the laser unit 9.

The control unit 1 comprises a calculation device, in this case a a microprocessor 4. A keyboard 2 is connected to the microprocessor 4. A first output of the microprocessor 4 is connected to a digital-to-analog converter 6. The output of the digital-to-analog converter 6 constitutes the first control output of the control unit and carries output signal I. A second output of the microprocessor 4 is connected to a digital-to analog converter 8. The output of the digital to analog converter 8 constitutes the second control output of the control unit and carries output signal T.

The first control input of the laser unit 9 is connected to a first input of a subtracter 10. The output of the subtracter 10 is connected to the input of an amplifier 14. The output of the amplifier 14 is connected to a first connection of a measuring resistor 21 and to a first input of a differential amplifier 27. A second connection of the measuring resistor 21 is connected to the anode of a laser diode 20 and to a second connection of the differential amplifier 27. The cathode of the laser diode 20 is connected to a point of constant potential further to be referenced earth. The output of the differential amplifier 27 is connected to a second input of the subtracter 10.

The second control input of the laser unit 9 is connected to a first input of a subtracter 12. The output of the subtracter 12 is connected to the input of an amplifier 16. The output of the amplifier 16 is connected to the input of a Peltier element 22. The Peltier element 22, together with the laser diode and an NTC resistor 24 is accommodated in a housing 18 in which these three elements are thermally coupled.

The NTC resistor 24 is included in a temperature measuring circuit (for example, a bridge), whose output is connected to the second input of the subtracter 12. The light generated by the laser is available at the output 23.

To calibrate the laser oscillator, the output 23 of the laser oscillator may be coupled to the input of a wavelength/power meter 26. The (digital) output of the wavelength/power meter 26 is then connected to a further input of the microprocessor 4.

In the laser oscillator as shown in FIG. 1 the physical quantities (i.e., characteristic) to be set are the wavelength and the power of the light to be emitted by the laser oscillator. The desired (i.e., predetermined) values of these quantities may be loaded into the microprocessor 4 by means of the keyboard 2. The microprocessor 4 calculates the values of the control signals I and T on the basis of the desired values of the power and the wavelength and on the basis of the relation between the control signals and the power and wavelength. The control signal I determines the current flowing through the laser diode 20, and while the control signal T determines the temperature of the laser diode.

The feedback amplifier 14 has a large gain factor so that the amplifier will adjust its output signal in such a way that its input signal, and thus the output signal of the subtracter 10, will be very small. The output signal of the differential amplifier 27 will then be equal to the signal I. As a result, the voltage across the resistor 21 is directly proportional to the signal I, so that the current flowing through the laser diode will be directly proportional to the quotient of the signal I and the resistance of the resistor 21.

The feedback amplifier 16 likewise has a large gain factor, as a result of which this amplifier will adjust its output signal in such a way that its input signal and, thus, the output signal of the subtracter 12 will be very small. Consequently, the output signal of the temperature measuring circuit is equal to the signal T, so that the temperature of the laser diode will be proportional to the control signal T.

According to the inventive idea the following can be written as in approximation for the relation between the values of the control signals I and T and the values of the wavelength and the power respectively, of the laser light:

$$\lambda - \lambda_R = A(T - T_R) + B(I - I_R) + C(I - I_R)^2$$
$$P - P_R = D(T - T_R) + E(I - I_R) \qquad (1)$$

Wherein $\lambda_R$ is the wavelength of the laser light if the control signal I is equal to a reference value $I_R$ and if also the control signal T is equal to a reference value $T_R$. $P_R$ is the power of the laser light if the control signal I is equal to the reference value $I_R$ and if also the control signal T is equal to the reference value $T_R$. Based on the desired values of $\lambda$ and P, the control signals I and can be derived as follows:

$$I_{1,2} = I_R + \frac{-\left(B - \frac{A \cdot E}{D}\right) \pm \sqrt{\left(B - \frac{A \cdot E}{D}\right)^2 - 4C\left(\lambda_R - \lambda + \frac{A(P - P_R)}{D}\right)}}{2C} \qquad \text{EQ. (2)}$$

$$T_{1,2} = T_R + \frac{P - P_R - E(I_{1,2} - I_R)}{D}$$

From EQ. (2), it can be observed that two solutions are possible for I and T (note I). For the setting of the laser unit, the value of I is taken first, while both the signal I and the associated signal T are situated in a permitted interval.

With the aid of the wavelength/power meter 26, it is possible to calibrate the relation between the control signals and the wavelength or the power of the laser light, respectively. This may be effected regularly for which the meter is constantly switched over between a number of laser oscillators, so that more laser oscillators can be calibrated with a single meter. Such a system is known, for example, from U.S. Pat. No. 4,942,568. Alternatively, it is possible for the calibration to take place only incidentally, for example, once a year.

If the relation between the control signals and the wavelength of the laser light and the relation between the control signals and the power of the laser light is expressed by EQ. (1), the values of the constants A, B, C, D and E are to be adapted during the calibration. For this purpose, the wavelength of the laser light belonging to three different combinations of values of the control signals is measured. For determining the constants D and E, it is only necessary to measure the power of no more than two different combinations of control signals. The new values of A, B, C, D and E are then determined in the following manner.

A first measurement of the wavelength is performed with a value of the control signal I equal to $I_R$ and with a value $T_a$ of the control signal T. If the measured wavelength is then equal to $\lambda_1$ and the measured power is equal to $P_1$, the following holds for the constants A and D, respectively:

$$A = \frac{\lambda_1 - \lambda_R}{T_a - T_R}, \quad D = \frac{P_1 - P_R}{T_a - T_R} \qquad \text{EQ. (3)}$$

Subsequently, a second and a third wavelength measurement is performed for which the control signal T is equal to $T_R$ and I adopts the values $I_R + \delta$ and $I_R - \delta$ respectively. For the measured wavelengths $\lambda_2$ and $\lambda_3$ respectively, and the measured power $P_2$ the following holds:

$$\lambda_2 - \lambda_R = B \cdot \delta + C \cdot \delta^2$$
$$\lambda_3 - \lambda_R = -B \cdot \delta + C \cdot \delta^2 \qquad \text{EQ. (4)}$$
$$P_2 - P_R = E \cdot \delta$$

From EQ. (4) the following can be simply derived for the values of B and C:

$$B = \frac{\lambda_2 - \lambda_3}{2 \cdot \delta} \qquad \text{EQ. (5)}$$

$$C = \frac{\lambda_2 + \lambda_3 - 2 \cdot \lambda_R}{2 \cdot \delta^2}$$

$$E = \frac{P_2 - P_R}{\delta}$$

Figure 2:
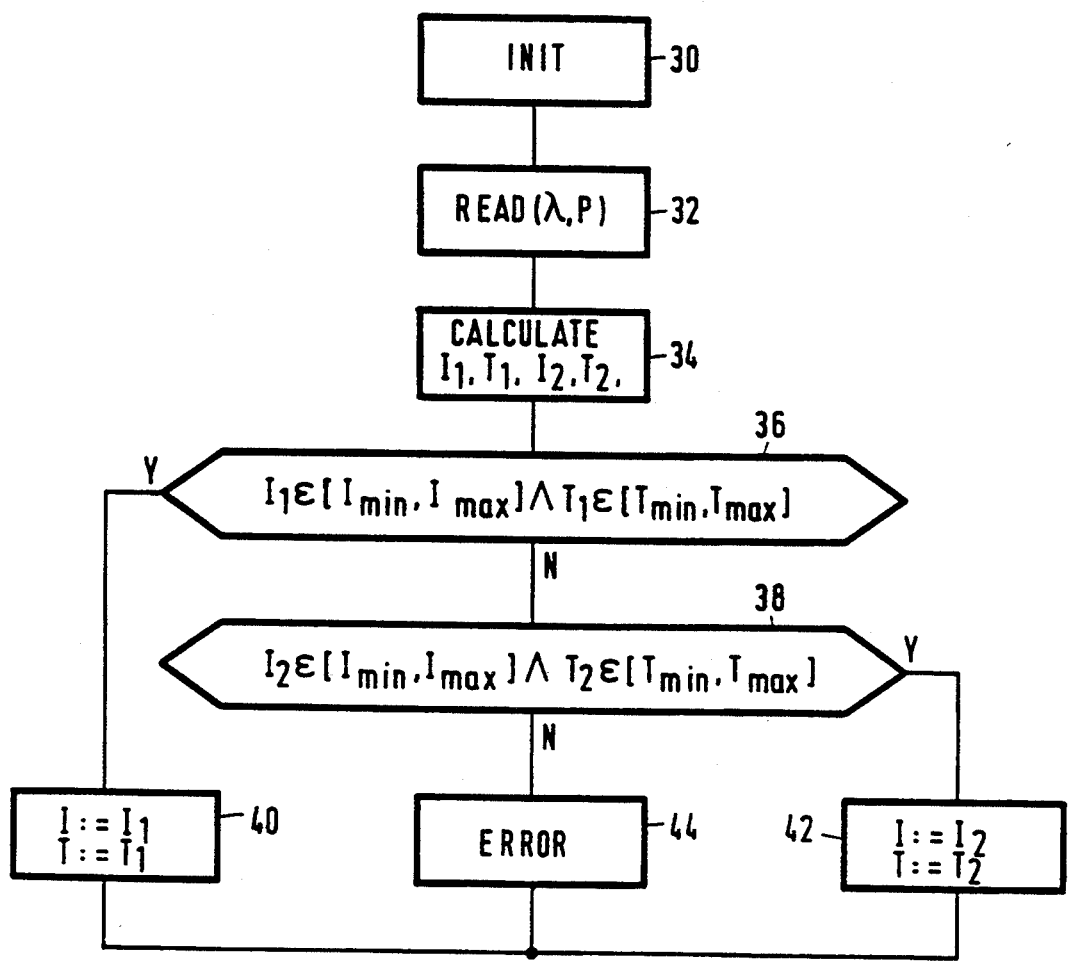
FIG. 2 shows a flowchart of a program for use by a processor 4 of FIG. 1 to control a laser unit 9 of FIG. 1.

In FIG. 2, a flow chart of a program to be used by the processor 4 in controlling the laser unit is set forth, the numbered instructions having the connotations as stated in the Table below.

| NR. | INSCRIPTION | CONNOTATION |
| --- | --- | --- |
| 30 | INIT | All variables used are initialized |
| 32 | READ($\mu$,P) | The desired values of wavelength and power are read from the keyboard. |
| 34 | CALCULATE $I_1,T_1$, $I_2,T_2$ | The values $I_1$, $I_{22}$ and associated $T_1$ and $T_2$ are calculated. |
| 36 | $I_1 \in [I_{min},I_{max}] \wedge$ $T_1 \in [T_{min},T_{max}]$ | A determination is made as to whether $I_1$ and $T_1$ are situated in the permitted interval. |
| 38 | $I_2 \in [I_{min},I_{max}] \wedge$ $T_2 \in [T_{min},T_{max}]$ | A determination is made as to whether $I_2$ and $T_2$ are situated in the permitted interval. |
| 40 | I:= $I_1$ T:= $T_1$ | The control signals I and T are made equal to the calculated values $I_1$ and $T_1$ respectively. |
| 42 | I:= $I_2$ T:= $T_2$ | The control signals I and T are made equal to the calculated values $I_2$ and $T_2$ respectively. |
| 44 | ERROR | An error message is given. |

The program of FIG. 2 works as follows:
In instruction 30, all variables required are initialized.
In instruction 32 the desired values of the wavelength $\lambda$ and the power P of the laser light are read from the keyboard 2.

In instruction 34, the two values $I_1$ and $I_2$ and the associated values $T_1$ and $T_2$ are calculated. This calculation is made on the basis of EQ. (2). In instruction 36, a determination is made as to whether the value $I_1$ is situated in the interval $[I_{min}, I_{max}]$ and whether the value $T_1$ is situated in the interval $[T_{min}, T_{max}]$. This determination is necessary because the values $I_1$ and $I_2$ are solutions to a quadratic equation and because a determination as to which of the two values leads to a solution in which both the value of I and the associated temperature for the laser unit is permissible cannot be made in advance. If both $I_1$ and $T_t$ are situated in the permitted interval, the control signals I and T are made equal to $I_1$ and $T_1$, respectively, in instruction 40. If either of the values $I_1$ or $T_1$ is not situated in the permitted interval, in instruction 38 a determination is made as to whether the value $I_2$ is situated in the interval $[I_{min}, I_{max}]$ and whether the value $T_2$ is situated in the interval $[T_{min}, T_{max}]$. If this condition is satisfied, the control signals I and T are made equal to $I_2$ and $T_2$ respectively, in instruction 42. If either of the values $I_2$ or $T_2$ is not situated in the permitted interval, an error message is given.

Figure 3:
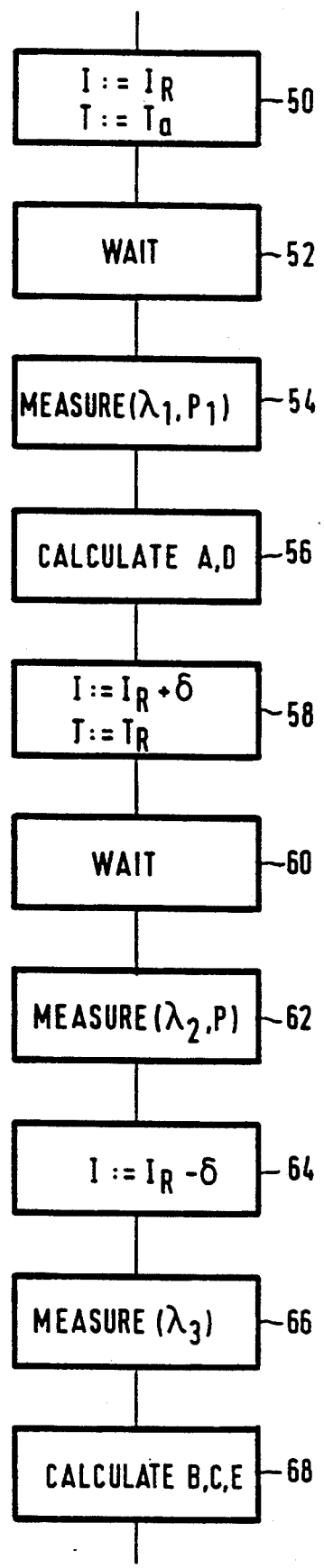
FIG. 3 shows a flowchart of a program for use by the processor 4 of FIG. 1 for the calibration of the laser oscillator.

In FIG. 3, a flow chart of a program to be used by the processor 4 for calibrating the laser oscillator is set forth, the numbered instructions having the connotations to be described in the Table below.

| NR. | INSCRIPTION | CONNOTATION |
|---|---|---|
| 50 | $I := I_R$  $T := T_a$ | The control signals I and T are made equal to the value $I_R$ and $T_a$, respectively. |
| 52 | WAIT | There is a certain waiting period. |
| 54 | MEASURE($\lambda_1, P_1$) | The values of the wavelength and the power are measured and assigned to the variables $\lambda_1$ and $P_1$, respectively. |
| 56 | CALCULATE A,D | The values of A and D are calculated. |
| 58 | $I := I_R + \delta, T := T_R$ | The control signals I and T are made equal to the value $I_R + \delta$ and $T_R$, respectively. |
| 60 | WAIT | There is a certain waiting period. |
| 62 | MEASURE($\lambda_2, P_2$) | The values of the wavelength and the power are measured and assigned to the variables $\lambda_2$ and $P_2$, respectively. |
| 64 | $I := I_R - \delta$ | The control signal I is made equal to $I_R - \delta$. |
| 66 | MEASURE($\lambda_3$) | The values of the wavelength measured and assigned to the variable $\lambda_3$. |

The program of FIG. 3 works as follows:

In instruction 50, the values of I and T are set at $I_R$ and $T_a$, respectively. Then there is a certain waiting period during which the laser unit is given the opportunity to adopt the temperature defined by the control signal T. In instruction 54, the wavelength and the power are measured and assigned to the variables $\lambda_1$ and $P_1$, respectively. In instruction 56, the values of A and D are calculated according to EQ. (3).

In instruction 58, the values of I and T are set at $I_R + \delta$ and $T_R$, respectively. In instruction 60, there is another waiting period before instruction 62. In instruction 62, the wavelength and the power of the laser light are measured and the values are stored under variables $\lambda_2$ and $P_2$, respectively. In instruction 64, the control signal I is made equal to the value $I_R - \delta$. Subsequently, in instruction 66, the wavelength is measured and assigned to the variable $\lambda_3$. In instruction 68, the constants B, C and E are calculated according to EQ. (5).

Figure 4:
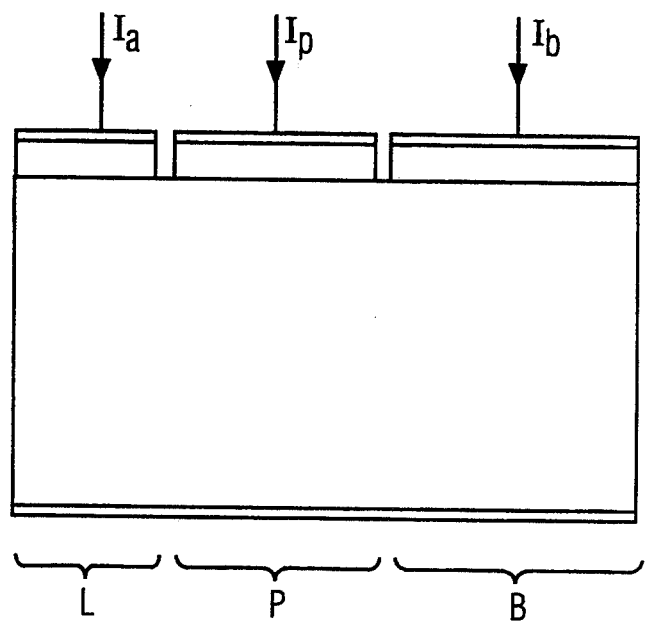
FIG. 4 shows a block diagram of a DBR laser.
Figure 5:
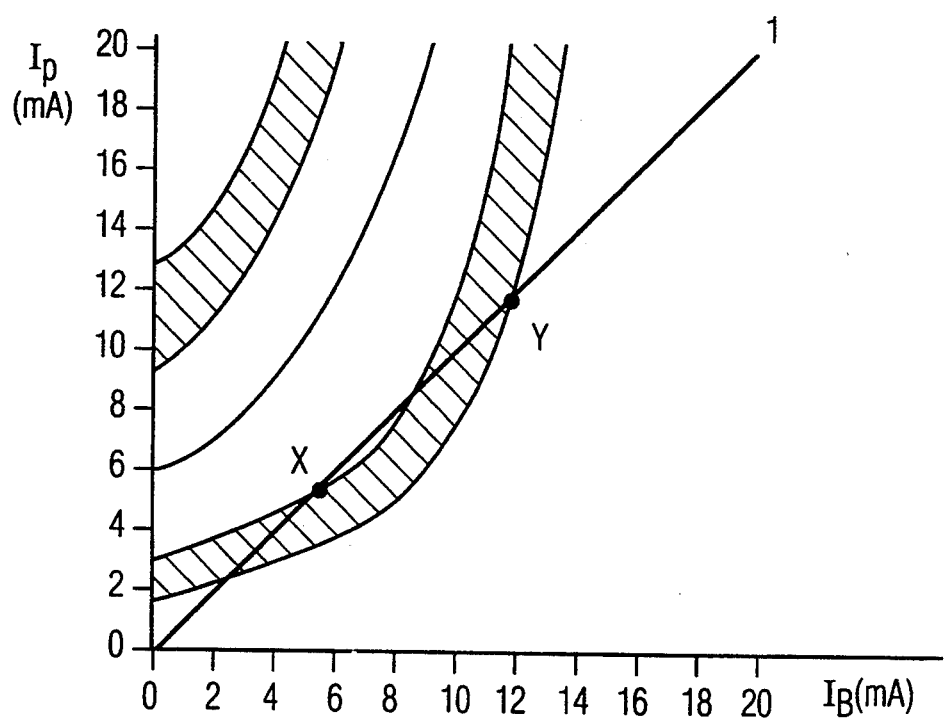
FIG. 5 shows a relationship between two control signals of a laser unit 9 which has to be satisfied to avoid frequency jumps.

FIG. 4 shows a block diagram of a DBR laser with control signals $I_a$, $I_p$ and $I_b$ as described above. FIG. 5 shows a characteristic of the DBR laser, the boundaries of the different oscillation modes being plotted against the tuning signals on the two frequency (i.e., wavelength) control inputs, i.e., control signals Ip and Ib. These boundaries are denoted by the character B. In the hatched area, the oscillation mode is uncertain. It is equal to the oscillation mode which existed prior to being crossed the boundary B.

In FIG. 5 two tuning curves 1 and 2 are shown. They markedly show that when tuning is effected according to tuning curve 1, this tuning curve crosses the boundary between different oscillation modes several times (e.g., point X and point Y), so that an undesired frequency jump will occur. By selecting the relation between the two control signals in accordance with curve 2, it is possible to avoid crossing the boundary between different oscillation modes. The relation between the two control signals is then a marginal (i.e., auxiliary) condition the control signals are to satisfy. Thus, in order to avoid a frequency jump, occurring in lasers having more control inputs than physical quantities, is advantageous to make the appropriate control signal(s) satisfy at least one auxiliary condition, e.g., boundary condition.

If such a laser unit has m control inputs and if n auxiliary conditions are forced on controls signals, m-n physical quantities of the laser light may be determined. The entire system is then described by m equations (n auxiliary conditions and m-n expressions for the physical quantities) with m unknowns (the control signals).

I claim:

1. A laser oscillator, comprising:
light producing means for producing a laser light; and
control means for applying at least one control signal to said light producing means to control at least one physical characteristic of the laser light, said control means including calculating means for calculating a value for the at least one control signal which will cause the at least one physical characteristic to be at a predetermined value on the basis of the predetermined value and a continuous relation between values for the at least one control signal and values for the at least one physical characteristic within a working range of said light producing means.

2. The laser oscillator as claimed in claim 1, wherein the at least one physical characteristic is wavelength of the laser light.

3. The laser oscillator as claimed in claim 1, wherein the at least one physical characteristic is power of the laser light.

4. The laser oscillator as claimed in claim 1, wherein the relation is defined by a truncated power series.

5. The laser oscillator as claimed in claim 4, wherein the laser oscillator further comprises measuring means for supplying to said control means at least one measurement signal which is a measure of an actual value of the at least one physical characteristic, and said control means is adapted to calibrate the relation in accordance with the at least one measurement signal for reducing the difference between the predetermined and actual values of the at least one physical characteristic.

6. The laser oscillator as claimed in claim 1, wherein the laser oscillator further comprises measuring means for supplying to said control means at least one measurement signal which is a measure of an actual value of the at least one physical characteristic, and said control means is adapted a relationship between each associated control signal and corresponding value of the at least one physical characteristic to calibrate the relation in accordance with the at least one measurement signal for reducing the difference between the predetermined and actual values of the at least one physical characteristic.

7. The laser oscillator as claimed in claim 1, wherein said control means further includes a keyboard for supplying the predetermined value thereto.

8. The laser oscillator as claimed in claim 1, wherein said control means applies a first number of control signals to said light producing means and the laser light has a second number of physical characteristics, the first number exceeding the second number; and wherein at least one of the control signals satisfies at least one auxiliary condition.

9. The laser oscillator as claimed in claim 8, wherein the at least one auxiliary condition is a boundary condition.

10. A laser oscillator, comprising:
light producing means for producing a laser light; and
control means for applying cs control signals to said light producing means to control pg physical characteristics of the laser light, said control means including calculating means for calculating values for the cs control signals which will cause each of the pg physical characteristics to be at a predetermined value on the basis of the predetermined value for each of pq physical characteristics and a continuous relation between values for each of the cs control signals and values for each of the pq physical characteristics within a working range of said light producing means;
wherein cs and pq are integers greater than 1.

11. The laser oscillator as claimed in claim 10, wherein cs and pq are equal to 2, the cs control signals are signals I and T, the pq physical characteristics are wavelength and power of the laser light, and the relation comprises the following set of relationships:

$$I = I_R + \frac{-(B - ((A \cdot E)/D) \pm \sqrt{(B - ((A \cdot E)/D)^2 - 4C(\lambda_R - \lambda) + (A \cdot (P - P_R)/D)}}{2C}$$

$$T = T_R + (P - P_R - (E \cdot (I - I_R))/D),$$

where $\lambda$ is the predetermined value of the wavelength; p is the predetermined value of the power; $\lambda_R$ is the wavelength of the laser light if signal I is equal to a reference value $I_R$ and signal T is equal to a reference value $T_R$; $P_R$ is the power of the laser light if signal I is equal to a reference value $I_R$ and signal T is equal to a reference value $T_R$; and A, B, C, D and E are coefficient constants.

12. The laser oscillator as claimed n claim 10, wherein the laser oscillator further comprises measuring means for supplying to said control means at least one measurement signal which is a measure of an actual value of at least one of the pq physical characteristics, and the control means is adapted to calibrate the relation in accordance with the at least one measurement signal for reducing differences between the predetermined and actual values of the pq physical characteristics.

13. The laser oscillator as claimed in claim 12, wherein cs and pq are equal to 2, the cs control signals are signals I and T, the pq physical characteristics are wavelength and power of the laser light, and the relation comprises the following set of relationships:

$$I = I_R + \frac{-(B - ((A \cdot E)/D) \pm \sqrt{(B - ((A \cdot E)/D)^2 - 4C(\lambda_R - \lambda) + (A \cdot (P - P_R)/D)}}{2C}$$

$$T = T_R + (P - P_R - (E \cdot (I - I_R))/D),$$

where $\lambda$ is the predetermined value of the wavelength; P is the predetermined value of the power; $\lambda_R$ is the wavelength of the laser light if signal I is equal to a reference value $I_R$ and signal T is equal to a reference value $T_R$; $P_R$ is the power of the laser light if signal I is equal to a reference value $I_R$ and signal T is equal to a reference value $T_R$; and A, B, C, D and E are coefficient constants.

14. The laser oscillator as claimed in claim 13, wherein said control means is adapted for calibrating the set of relationships by determining coefficients constants, A, B, C, D and E in accordance with a first measurement signal including a first measurement of an actual value of the wavelength and a first measurement of an actual value of the power, a second measurement signal including a second measurement of an actual value of the wavelength and a second measurement of an actual value of the power and a third measurement signal including a third measurement of an actual value of the wavelength.

15. The laser oscillator as claimed in claim 14, wherein the first measurements are performed with signal I being equal a value $I_R$ and signal T being equal to a value $T_a$, the first measurement of the actual value of the wavelength being equal to $\lambda_1$ and the first measurement of the actual value of the power being equal to $P_1$; and the second and third measurements are performed with signal I being equal to the values $I_R+\delta$ and $I_R-\delta$, respectively, and signal T being equal to $T_R$, the second measurement of the actual value of the wavelength being equal to $\lambda_2$, the third measurement of the actual value of the wavelength being equal to $\lambda_3$, the second measurement of the actual value of the power being equal to $P_2$, and $\lambda_2$, $\lambda_3$ and $P_2$ being related to each other as follows:

$$\lambda_2 - \lambda_R = (B \cdot \delta) \cdot (C \cdot \delta^2)$$

$$\lambda_3 - \lambda_R = (B \cdot \delta) \cdot (C \cdot \delta^2)$$

$$P_2 - P_R = E \cdot \delta;$$

wherein the coefficient constants A, B, C, D and E are as follows:

$$A = (\lambda_1 - \lambda_R)/(T_a - t_R)$$

$$B=(\lambda_2-\lambda_3)/(2\cdot\delta)$$

$$C=((\lambda_2\lambda_3)-(2\cdot\lambda_R))/(2\cdot\delta^2)$$

$$D=(P_1-P_R)/(T_a-t_R)$$

$$E=(P_2-P_R)/(\delta).$$

16. The laser oscillator as claimed in claim 10, wherein cs is greater than pq, and at least one of the cs control signals satisfies an auxiliary condition.

17. The laser oscillator as claimed in claim 16, wherein cs is greater than pq by 1, and two of the cs control signals satisfy a boundary condition.

18. A method of controlling a laser oscillator including a light producing means for producing a laser light, the method comprising:
  selecting a predetermined value for at least one physical characteristic of the laser light;
  calculating a value for at least one control signal which will cause said at least one physical characteristic to be at the predetermined value on the basis of the predetermined value for the at least one physical characteristic and a truncated power series relating values for the at least one control signal to values for the at least one physical characteristic within a working range of the light producing means; and
  supplying the light producing means with the at least one control signal having the value calculated thereof.

19. A method of controlling a laser oscillator, including a light producing means for producing a laser light, the method comprising:
  selecting a predetermined value for each of pq physical characteristics of the laser light;
  calculating values for cs control signals which will cause each of the pq physical characteristics to be at the predetermined value thereof on the basis of the predetermined value for each of the pq physical characteristics and a continuous relation between values for the cs control signals and values for the pq physical characteristics within a working range of said light producing means; and
  supplying the light producing means with the cs control signals having the values calculated therefor;
  wherein cs and pq are integres greater than 1.

20. The method as claimed in claim 19, wherein the relation is a truncated power series.

21. The method claimed in claim 20, wherein cs and pq are equal to 2, the cs control signals are signals I and T, the pq physical characteristics are wavelength and power of the laser light, and the relation comprises the following set of relationships:

$$I = I_R + \frac{-(B - ((A \cdot E)/D) \pm \sqrt{(B - ((A \cdot E)/D)^2 - 4C(\lambda_R - \lambda) + (A \cdot (P - P_R)/D)}}{2C}$$

$$T = T_R + (P - P_R - (E \cdot (I - I_R))/D),$$

where $\lambda$ is the predetermined value of the wavelength; P is the predetermined value of the power; $\lambda_R$ is the wavelength of the laser light if signal I is equal to a reference value $I_R$ and signal T is equal to a reference value $T_R$; $P_R$ is the power of the laser light if signal I is equal to a reference value $I_R$ and signal T is equal to a reference value $T_R$; and A, B, C, D and E are coefficient constants.

22. The method as claim 21, further comprising calibrating the set of relationships by determining coefficient constants A, B, C, D and E as follows:
  setting signal I to a value $I_R$ and signal T to a value $T_a$ and measuring the wavelength and power of the laser light to obtain a first measurement of an actual value of the wavelength and a first measurement of the actual value of the power, the first measurement of the actual value of the wavelength being equal to $\lambda_1$ and the first measurement of the actual value of the power being equal to $P_1$;
  determining coefficient constants A and D in accordance with the following first additional set of relationships:

$$A=(\lambda_1-\lambda_R)/(T_a-T_R)$$

$$D=(P_1-P_R)/(T_a-T_R);$$

setting signal I to values $I_R+\delta$ and $I_R-\delta$ and signal T to a value $T_R$ and measuring the wavelength and power of the laser light to obtain a second and third measurement of an actual value of the wavelength, respectively, and a second measurement of the actual value of the power, the second measure of the actual value of the wavelength being equal to $\lambda_2$, the third measurement of the actual value of the wavelength being equal to $\lambda_3$, the second measurement of the actual value of the power being equal to $P_2$, and $\lambda_2$, $\lambda_3$ and $P_2$ being related to each other as follows:

$$\lambda_2-\lambda_R=(B\cdot\delta)\cdot(C\cdot\delta^2)$$

$$\lambda_3-\lambda_R=(B\cdot\delta)\cdot(C\cdot\delta^2)$$

$$P_2-P_R=E\cdot\delta;\text{ and}$$

determining coefficient constants B, C and D in accordance with the following second addition set of relationships:

$$B=(\lambda_2-\lambda_3)/(2\cdot\delta)$$

$$C=((\lambda_2+\lambda_3)-(2\cdot\lambda_R))/(2\cdot\delta^2)$$

$$E=(P_2-P_R)/(\delta).$$

* * * * *